(12) United States Patent
Landy et al.

(10) Patent No.: US 6,658,628 B1
(45) Date of Patent: Dec. 2, 2003

(54) DEVELOPEMENT OF HARDMAC TECHNOLOGY FILES (CLF, TECH AND SYNLIB) FOR RTL AND FULL GATE LEVEL NETLISTS

(75) Inventors: Robert E. Landy, San Jose, CA (US); Michael Porter, Milpitas, CA (US); Peter F. Lindberg, Maple Grove, MN (US); Craig R. Lang, Brooklyn Center, MN (US)

(73) Assignee: LSI Logic Corporation, Milpitas, CA (US)

(*) Notice: Subject to any disclaimer, the term of this patent is extended or adjusted under 35 U.S.C. 154(b) by 188 days.

(21) Appl. No.: 10/025,123

(22) Filed: Dec. 19, 2001

(51) Int. Cl.[7] ............................................. G06F 17/50
(52) U.S. Cl. ........................... 716/1; 716/6; 716/18
(58) Field of Search ................................... 716/1–21

(56) References Cited

U.S. PATENT DOCUMENTS

| | | | | |
|---|---|---|---|---|
| 5,499,192 A | * | 3/1996 | Knapp et al. ............ | 716/17 |
| 5,812,416 A | * | 9/1998 | Gupte et al. ............ | 716/2 |
| 6,120,550 A | * | 9/2000 | Southgate et al. ........ | 716/11 |
| 6,453,451 B1 | * | 9/2002 | Lakshmanan et al. ...... | 716/6 |
| 6,526,562 B1 | * | 2/2003 | Haddad et al. .......... | 716/18 |
| 6,587,997 B1 | * | 7/2003 | Chen et al. ............ | 716/4 |

OTHER PUBLICATIONS

Ay et al., "Automatic Logic and Timing Model Generation for Cell Based Design," 1992 Proc. 5th Annual IEEE Int'l ASIC Conference and Exhibit, pp. 335–338.*

Cheng et al., "Automatically Updating Technology Dependent Information in Design Automation," 1993 Proc. 4th European Conference on Design Automation, pp. 328–333.*

* cited by examiner

Primary Examiner—Leigh M. Garbowski
(74) Attorney, Agent, or Firm—Christorpher P. Maiorana, P.C.

(57) ABSTRACT

A method for generating one or more hardmacro technology files comprising the steps of determining a netlist, generating a timing constraints file in response to (i) the netlist and (ii) a time budget, and generating the hardmacro technology files in response to (i) the netlist and (ii) the timing constraints file.

20 Claims, 4 Drawing Sheets

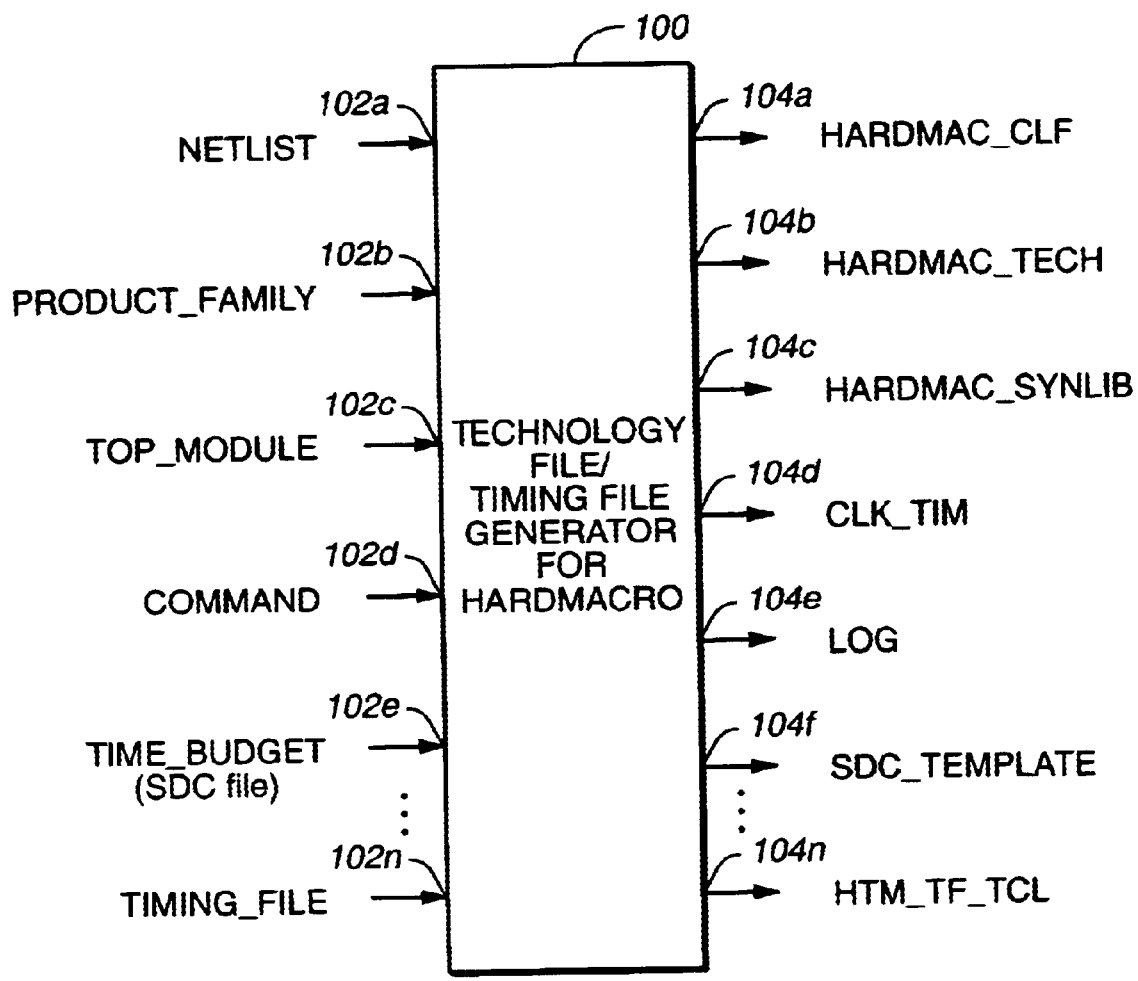
FIG._1

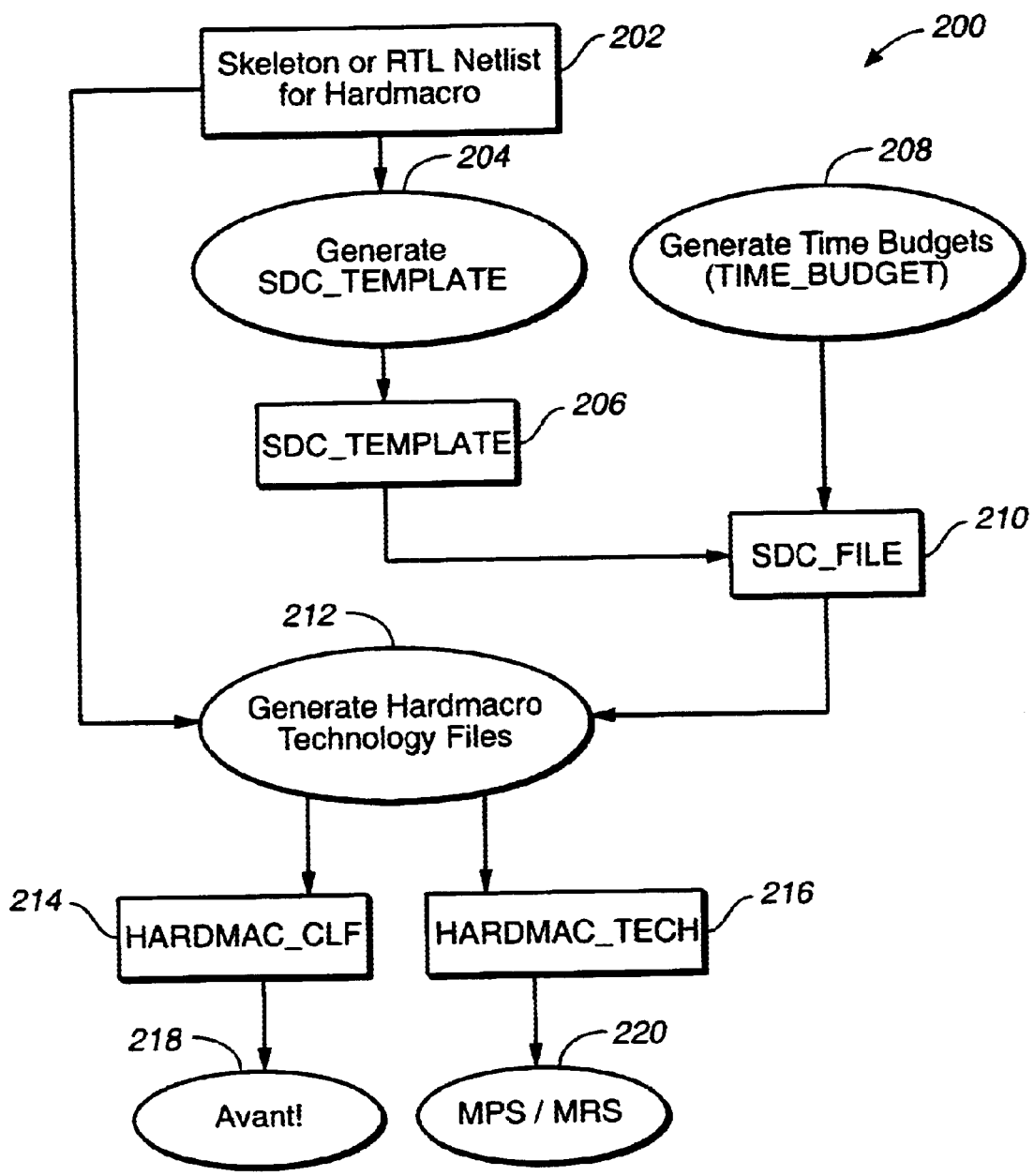
FIG._2

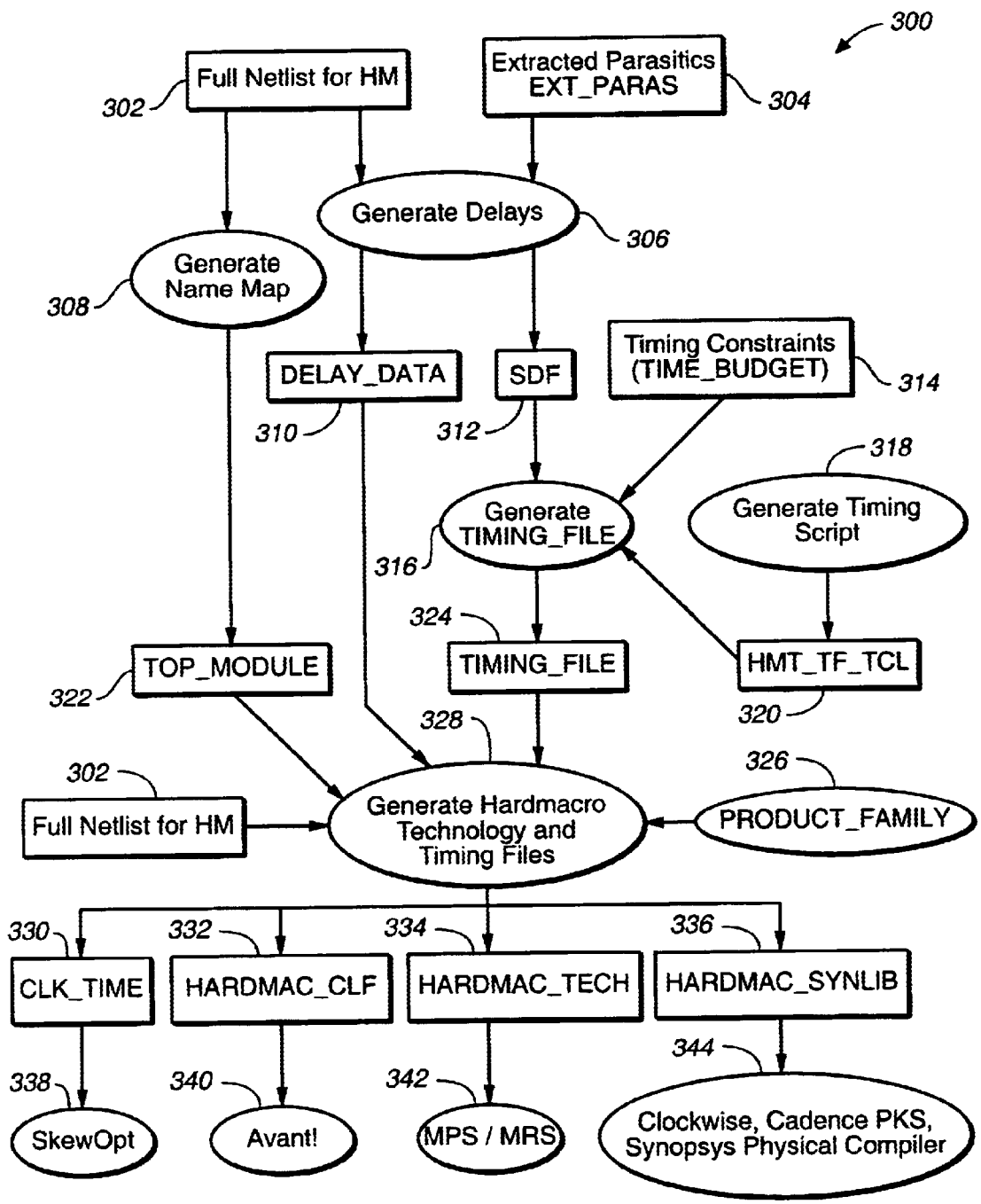
FIG._3

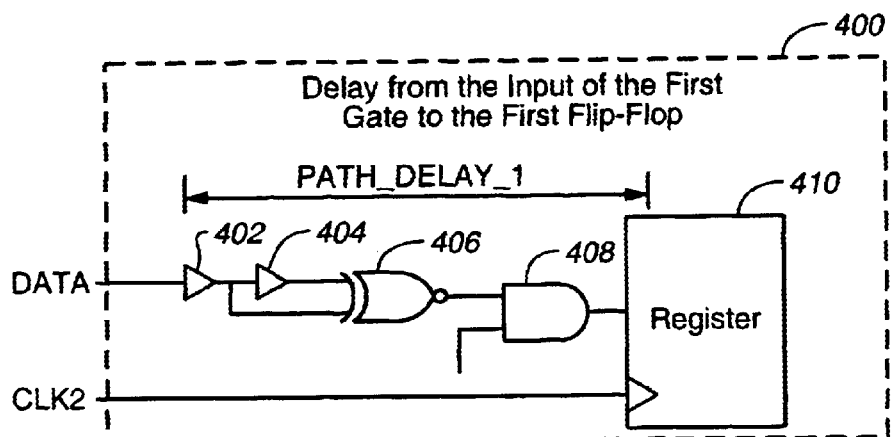
FIG._4a
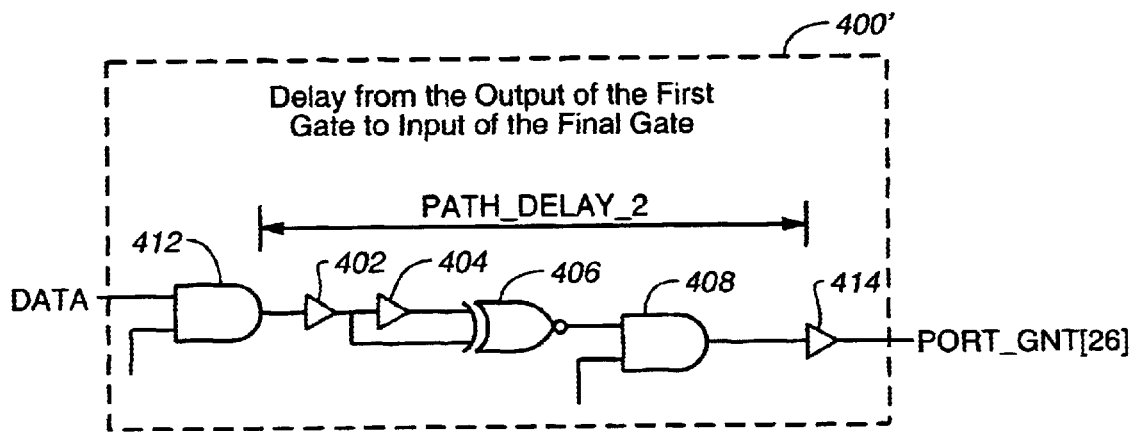
FIG._4b
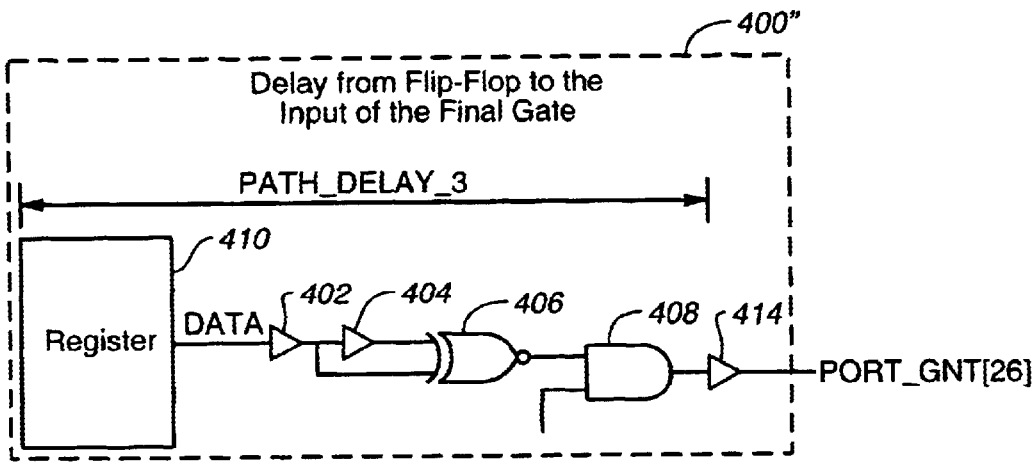
FIG._4c

DEVELOPEMENT OF HARDMAC TECHNOLOGY FILES (CLF, TECH AND SYNLIB) FOR RTL AND FULL GATE LEVEL NETLISTS

FIELD OF THE INVENTION

The present invention relates to a method and/or architecture for generating technology files for hardmacros generally and, more particularly, to a method and/or architecture for generating technology and/or timing files for traditional hardmacros as well as hierarchical hardmacros (HHMs) and cores.

BACKGROUND OF THE INVENTION

Conventional layout tools (i.e., Avant!® Corporation Avant! Apollo-II™, Discovery™, Mars™, Saturn™, etc.) generate hardmacro (hardmac) files for placement and routing layout information for integrated circuit designs. Conventional hardmac generator tools fail to provide one or more of the following features: (i) accurate prediction of repeater insertion into the layout, (ii) transportable file formats or syntax (i.e., files that are generated in formats or syntax that can be read and/or processed by other synthesis/layout/analysis tools that are implemented simultaneously with and/or subsequent to the hardmac generation tools), (iii) accurate delay and/or slack calculation, and/or (iv) hardmacro generation for skeleton, register-transfer-level (RTL) and/or full gate (FGN) netlist based flows.

It would be desirable to have a hardmac development tool that provides accurate skeleton, RTL, and/or FGN netlist technology files for hardmacro files in one or more transportable file formats.

SUMMARY OF THE INVENTION

The present invention concerns a method for generating one or more hardmacro technology files comprising the steps of determining a netlist, generating a timing constraints file in response to (i) the netlist and (ii) a time budget, and generating the hardmacro technology files in response to (i) the netlist and (ii) the timing constraints file.

The objects, features and advantages of the present invention include providing a hardmac technology file and/or timing file generation tool that may provide (i) accurate die size estimates, (ii) accurate prediction of repeater insertion into the layout, (iii) transportable language or syntax (e.g., hardmacro and/or clock timing files generated in formats or syntax that can be read and/or processed by other synthesis/layout/analysis tools), (iv) accurate delay and/or slack calculation, and/or (v) hardmacro generation for skeleton, register-transfer-level (RTL) and/or full gate (FGN) netlist based flows.

BRIEF DESCRIPTION OF THE DRAWINGS

These and other objects, features and advantages of the present invention will be apparent from the following detailed description and the appended claims and drawings in which:

FIG. 1 is a block diagram of a preferred embodiment of the present invention;

FIG. 2 is a flow chart illustrating an operation of the present invention;

FIG. 3 is a flow chart illustrating an alternative operation of the present invention; and FIGS. 4(a–c) are block diagrams of delay circuits of the process of FIG. 3.

DETAILED DESCRIPTION OF THE PREFERRED EMBODIMENTS

Referring to FIG. 1, a block diagram of a method 100 is shown in accordance with a preferred embodiment of the present invention. The method 100 may be implemented as a hardmacro technology file and/or timing file generation method (e.g., process, tool, routine, etc.). The method 100 may generate technology files for traditional hardmacros as well as hierarchical hardmacros (HHMs) and cores (or memories). The method 100 may be configured to generate technology files for hardmacros in a number of transportable formats (or syntaxes). The technology file formats maybe proprietary and/or standard formats. For completed hardmacros, the tool 100 may generate technology files that accurately model the interface to and from a block. The method 100 may generate one or more clock timing files. In one example, the clock timing files may be implemented as netlist timing files. However, any appropriate timing files may be generated accordingly to meet the design criteria of a particular application. The method 100 generally bases timing values on the post-layout standard delay format (SDF) delays. In one example, the tool 100 may also generate technology files that approximate one or more delays that correspond to hardmacro boundaries before a netlist for the corresponding macro is stable. The method 100 may be implemented as a portion of a design flow procedure such as the FlexStream™ Design Flow produced by LSI Logic® Corporation.

The method 100 is generally implemented in a computer medium (e.g., a medium including but not limited to any type of disk including floppy disk, optical disk, CD-ROM, and magneto-optical disks, ROMs, RAMs, EPROMs, EEPROMs, Flash memory, magnetic or optical cards, firmware, or any type of media suitable for storing electronic instructions). However, any appropriate storage medium including instructions which can be used to perform a process (e.g., execute one or more appropriate instructions) in accordance with the present invention may be implemented accordingly to meet the design criteria of a particular application.

There are generally two stages of an overall design process of a design flow where the method (or process) 100 may be implemented. In one example, the method 100 may be implemented at the beginning of a design cycle when a skeleton netlist (e.g., a SRN netlist) description for the hardmacro is available (described in connection with FIG. 2). In another example, the method (or process) 100 may be implemented when a full Verilog (or other appropriate syntax) gate-level netlist (e.g., a FGN netlist) mapped to the appropriate circuit design gates is available (described in connection with FIG. 3). The SRN flow implementation of the method 100 may be related to (e.g., correspond to) a top-down design approach, while the FGN flow implementation of the method 100 may be configured to generate a flow design from the bottom up.

In the skeleton netlist mode, new technology files may be generated (e.g., the method 100 may be implemented) whenever time budget files are changed. In the full gate-level netlist mode, the technology files may be updated (e.g., the method 100 may be implemented) whenever a new standard delay format (SDF) timing constraint file is available. A new hardmac file is generally generated when the interface timing has changed enough to warrant re-generating the technology file views. However, when a core is being developed, the method 100 is generally not implemented prior to completion of the core. When (i) a design uses a hierarchical design flow or (ii) a hardmacro is to be generated as part of the design, the method 100 may be implemented two or more times. A first implementation of the method 100 may be used to generate the technology files for preclock use. The method 100 may also be implemented after clocks are inserted in the design to generate a clock timing file for subsequent synthesis and/or analysis.

The method 100 may comprise one or more inputs 102a–102n that may receive one or more technology input files (e.g., NETLIST, PRODUCT_FAMILY, TOP_MODULE, EXT_PARAS (not shown), COMMAND, TIME_BUDGET, DELAY_DATA (not shown), and TIMING_FILE). However, any appropriate number and/or type of input files may be implemented to meet the design criteria of a particular application (e.g., the type of flow generated using the method 100). The method 100 also may comprise one or more outputs 104a–104n that may present one or more technology output files (e.g., HARDMAC_CLF, HARDMAC_TECH, HARDMAC_SYNLIB, CLK_TIM, LOG, SDC_TEMPLATE, and HMT_TF_TCL). However, any appropriate number and/or type of output files may be implemented to meet the design criteria of a particular application. The method 100 may be configured to generate one or more of the output files HARDMAC_CLF, HARDMAC_TECH, etc. in response to one or more of the input files NETLIST, PRODUCT_FAMILY, etc.

The file NETLIST may be implemented as one or more netlists that contain either (i) mapped gates (e.g., full gate netlist (FGN) flow) or (ii) a skeleton/empty module/register-transfer-level (RTL) netlist (e.g., SRN flow). When the clock timing file flow is generated, the file NETLIST is generally implemented as the gate-level FGN netlist for the full chip. In one example, the input file NETLIST may be implemented as a Verilog netlist file. In another example, the file NETLIST may be implemented as a netlist description language (NDL) file. However, any appropriate type and/or format netlist file may be implemented accordingly to meet the design criteria of a particular application.

The file PRODUCT_FAMILY may be implemented as one or more technology libraries configured to contain technology-specific and/or cell-specific information. In one example, the file PRODUCT_FAMILY may be implemented as one or more product family libraries configured in a format having a .tech suffix (e.g., PRODUCT_FAMILY.tech files). However, any appropriate number, file format, type of technology, and/or cell specific input files may be implemented accordingly to meet the design criteria of a particular application.

The file TOP_MODULE may be implemented as one or more name map files (e.g., for FGN flow implementation of the method 100). In one example, the file TOP_MODULE may be implemented as an ASCII file having a .nmap suffix (e.g., TOP_MODULE.nmap). However, the file TOP_MODULE may be implemented as any appropriate file type accordingly to meet the design criteria of a particular application. The file TOP_MODULE generally contains the names of one or more design objects (e.g., modules, pins, nets, instances, etc.). The design objects contained in the file TOP_MODULE may be mapped from one language (format or syntax) to another when the method 100 translates information back and forth between a source language and a destination language. The file TOP_MODULE generally specifies the design root module (e.g., the module that contains the entire design).

The file EXT_PARAS (described in connection with FIG. 3) may be implemented as a standard parasitic extraction (SPEF) parasitics file. The file EXT_PARAS generally includes resistance and capacitance information that corresponds to the design objects that are implemented in a particular design. However, any appropriate parasitic information may be included accordingly to meet the design criteria of a particular application. The file COMMAND may be implemented as a line options file (e.g., a COMMAND.options file). The file COMMAND generally contains command line options that are implemented by a user when the method 100 is implemented (described below in connection with FIGS. 2 and 3).

The file TIMING_FILE may be implemented as a timing constraints (or time budget) file. The file TIMING_FILE may be implemented when the process 100 is configured to generate FGN flow based hardmacro files. The tool 100 generally parses the TIMING_FILE file timing reports that correspond to the input and output ports of a particular hardmacro.

The file DELAY_DATA (not shown) may be implemented as one or more design object delay information files. The file DELAY_DATA may be a time budget file. The file DELAY_DATA is generally implemented when the method 100 is configured to generate FGN flow based hardmacro files. In one example, the file DELAY_DATA may be implemented as an intermediate file in the process 100. A state or sub-process in the process 100 may be configured to generate the file DELAY_DATA (described in connection with FIG. 3). The tool 100 generally parses the file DELAY_DATA for design-specific data accordingly to meet the design criteria of a particular application.

The file TIME_BUDGET may be implemented as a Synopsys® Design Constraints (SDC) format file (e.g., a file generated in a format or syntax corresponding to a .sdc suffix) that corresponds to the appropriate time budget (or timing constraints) for a particular design. The file TIME_BUDGET is generally implemented in SRN flow based implementations of the method 100. However, the file TIME_BUDGET may also be implemented in FGN flow based implementations of the method 100. In one example, a template for the file TIME_BUDGET may be generated via a -sdc_template switch (or command, described below). However, any appropriate switch (or command) may be implemented accordingly to meet the design criteria of a particular application.

The output file HARDMAC (e.g., any one or more of the files HARDMAC_CLF, HARDMAC_TECH, and HARDMAC_SYNLIB) may be implemented as a hardmacro technology file. The method 100 may be configured to generate the file HARDMAC in one or more syntaxes (e.g., HARDMAC_CLF, HARDMAC_TECH, and HARDMAC_SYNLIB, where CLF, TECH, and SYNLIB generally correspond to files represented by the suffixes .clf, .tech, and .synlib, respectively). The suffixes .clf, .tech, and synlib may be associated with files generated in respective file formats (or syntaxes).

For example, the Avant! design tools (produced by the Avant! Corporation) may be configured to read and/or process files implemented with the .clf suffix (e.g., files generated in the .clf format such as the file HARDMAC_CLF). Similarly, the LSI Logic Corporation MPS™ and MRS™ design tools may be configured to read and/or process files generated in the format corresponding to the .tech suffix (e.g., the file HARDMAC_TECH). The file HARDMAC_SYNLIB may have a synlib suffix and may be read and/or processed by any appropriate design tool (e.g., Celestry® (formerly Ultima Interconnect Technology, Inc.) Clockwise™, Cadence® Design Systems, Inc. Physically Knowledgeable Synthesis (PKS)™, Synopsys® Physical Compiler™, etc.). The files HARDMAC_CLF and HARDMAC_TECH may be presented to a pre-existing product design layout directory (not shown). The files stored in the product design layout directory are generally available for subsequent processing and/or analysis (not shown). Alternatively, when the product design layout directory has not yet been generated, the method 100 may be configured to generate the product design layout directory. The file HARDMAC_SYNLIB may be presented to a Verilog directory (not shown).

The file CLK_TIM may be implemented as a path delay data file. The file CLK_TIM may be a clock timing file. In one example, the file CLK_TIM may be generated in a format that corresponds to a .clk_tim suffix (e.g., a file CLK_TIM.clk_tim). The file CLK_TIM.clk_tim may be read and/or processed by subsequent design tools (e.g., LSI Corporation SkewOpt™, not shown). In other examples, the file CLK_TIM may be generated in formats that correspond to the .clf, .tech, and/or .synlib suffixes. Subsequent processing and/or analysis (not shown) may be configured to process the file CLK_TIM to provide path delay information for top-level skew minimization. The file CLK_TIM may be presented to a clock/timing shell directory (not shown). The method 100 may be configured to generate the file CLK_TIM in response to timing constraint (or time budget) files (e.g., the files TIME_BUDGET, TIMING_FILE, and/or any other appropriate timing files accordingly to meet the design criteria of a particular application). The method 100 may be configured to generate one or more timing sections (e.g., the appropriate format CLK_TIM file) that correspond to the technology files selected by one or more command options (e.g., -avtech, -clf, and/or -synlib, described below).

The file SDC_TEMPLATE may be implemented as an SDC timing budget template file. The file SDC_TEMPLATE may be an intermediate file in the method 100. The file SDC_TEMPLATE may be manually edited by the user to provide the timing budget when the method 100 is configured to generate SRN flow based files. The file LOG may be implemented as a message log file. The file LOG may be placed in the directory associated with the method 100 (not shown).

The file HMT_TF_TCL may be implemented as a Synopsys® PrimeTime® script file (e.g., a file having a format corresponding to a .tcl suffix). The file HMT_TF_TCL may be implemented as intermediate file during the process 100. The file HMT_TF_TCL may be configured as extracted data from one or more timing information files (e.g., the files TIME_BUDGET, TIMING_FILE, and/or any other appropriate timing files accordingly to meet the design criteria of a particular application) to generate the file TIMING_FILE.

In one example, a command (or switch) line format for the method 100 may be as follows:

```
lsihmtech top_module <TOP_MODULE>
technology <PRODUCT_FAMILY>
language <LANGUAGE_NAME>
nets <NETLIST>
[-name_map <TOP_MODULE>]
[-timing_file <TIMING_FILE>|<timfile1 timfile2 . . . >]
```

-continued
```
[-hmt_tf_tcl [<HMT_TF_TCL>]]
[-exclude_clock_info]
[-exclude_timing_reqs]
[-delaydata <DELAY_DATA>|<delaydata1 delaydata2 . . . >]
[-sdc <SDC_FILE>]
[-avtech]
[-clf]
[-synlib]
[-clock_timing]
[-sdc_template]
[-help]
[-version]
``` where the commands:

-top_module <TOP_MODULE> may specify the root module of the design (e.g., the name of the module containing the entire design). In one example, the file TOP_MODULE may be implemented as the root module. However, any appropriate file and/or directory may be implemented as the root module accordingly to meet the design criteria of a particular application.

-technology <PRODUCT_FAMILY> may specify the appropriate technology or product family implemented in the design. In one example, the file PRODUCT_FAMILY may be implemented as the technology or product family implemented in the design. However, any appropriate technology and/or product family library file may be implemented accordingly to meet the design criteria of a particular application.

-language <LANGUAGE_NAME> may specify the language used in the source design files. A file (e.g., LANGUAGE_NAME) may represent the source design file language (e.g., NDL, Verilog, etc.).

-nets <NETLIST> may specify the list of source netlist files for the design (e.g., the one or more files NETLIST). In one example, the UNIX wildcard character * may be implemented. The netlist files (e.g., the one or more files NETLIST) are generally configured in the same language as specified in the language option command line (e.g., the language specified by the file LANGUAGE_NAME).

-name_map <TOP_MODULE> may specify the name map file prefix. The default file is generally TOP_MODULE.nmap. However, any one or more appropriate files may be specified accordingly to meet the design criteria of a particular application. The method 100 may be configured such that multiple name map files may be entered (e.g., one name map file for the top-level design and additional name map files for sub-modules, including cores). The method 100 is generally configured such that the name for the top module does not match the name of a sub-module in the design. When the name for the top module matches the name of a sub-module, the file specified may be read twice: once as the top module (as specified in the -name_map <TOP_MODULE> command option) and once by default because the method 100 generally chooses the name corresponding to a module name in the design as a name map file for the top module.

-timing_file <TIMING_FILE> may specify one or more timing files (e.g., the file TIMING_FILE) that may be generated in response to one or more input files (e.g., the files NETLIST, EXT_PARAS, etc.). In one example, the file TIMING_FILE may be implemented as an intermediate file in the process 100. In another example, the file TIMING_FILE may be an input file to the process 100.

-hmt_tf_tcl <HMT_TF_TCL> may direct the method 100 to generate TCL script for implementation in the generation of the file TIMING_FILE. In one example, data contained in the file HMT_TF_TCL may provide the file TIMING_FILE with TCL script generation parameters implemented using the method 100. However, any appropriate file may contain the file TIMING_FILE TCL script generation parameters accordingly to meet the design criteria of a particular application. In one example, the method 100 may be configured to generate best case, worst case, and/or test timing conditions in response to the command -hmt_tf_tcl <HMT_TF_TCL>. However, the method 100 may be configured to generate any appropriate timing accordingly to meet the design criteria of a particular application.

-exclude_clock_info may direct the method 100 to exclude an output clock section of the file TIMING_FILE TCL script that may contain commands to collect clock information that may be directed to flow that corresponds to the file CLK_TIM.

-exclude_timing_reqs may direct the method 100 to exclude a section from the file TIMING_FILE TCL script that may direct the method 100 to collect timing information that is used specifically for generation of one or more files that are generated in the format corresponding to the .tech suffix.

-delaydata <DELAY_DATA> may specify the one or more DELAY_DATA files generated via the method 100.

-sdc <SDC_FILE> may specify a file (e.g., SDC_FILE) that may be generated when the method 100 has a skeleton (e.g., SRN) netlist flow. The file SDC FILE may be a timing constraints (or time budget) file. The file SDC_FILE is generally implemented as an intermediate file in the process 100 (described in connection with FIG. 2). A template for the file SDC_FILE may be generated via the switch (or command) -sdc_template.

-avtech may specify the generation of one or more files (e.g., the file HARDMAC_TECH, etc.) that are generated in the format (or syntax) that corresponds to the MPS/MRS .tech suffix.

-clf may specify the generation of one or more files (e.g., the file HARDMAC_CLF) that are generated in the format (or syntax) corresponding to the Avant! .clf suffix.

-synlib may specify the generation of one or more files (e.g., the file HARDMAC_SYNLIB) that are generated in the format (or syntax) corresponding to the Synopsys .synlib suffix.

-clock_timing may specify the generation of one or more clock timing files (e.g., the file CLK_TIM.clk_tim, etc.).

-sdc_template may specify the generation of a SDC template file (e.g., the file SDC_TEMPLATE) (described in connection with FIG. 2) that may be generated when the process 100 is implemented in connection with (i) SRN flow and (ii) RTL synthesis.

-help may direct the method 100 to display help information about all method 100 commands (or switches), arguments and options.

-version may direct the method to display the version number of the process 100 that is implemented.

However, any appropriate command line format and command structure may be implemented accordingly to meet the design criteria of a particular application.

Referring to FIG. 2, a flow diagram 200 illustrating an operation of the present invention is shown. The operation (or method) 200 may be implemented as one example mode of operation of the method (or process) 100. The method 200 may be configured to generate one or more hardmacro technology files for an SRN flow. The SRN flow may be based on a skeleton netlist, an empty module netlist, an RTL level netlist, and/or Verilog files of individual hierarchical hardmacros (HHMs). The method 200 (e.g., SRN flow based file generation) is generally implemented when top level hardmacro timing is desired and the hardmacro netlist is incomplete and/or unavailable. The top level hardmacro timing is often desired and the hardmacro netlist is incomplete and/or unavailable when a large chip design is implemented with a hierarchical design flow. The method 200 may be configured to read in a Verilog (or any other appropriate language) skeleton netlist (e.g., the file NETLIST) and an SDC file (e.g., the file TIME_BUDGET) and generate one or more technology output files (e.g., the files HARDMAC_CLF, HARDMAC_TECH, etc.). The tool 200 may be configured to read (i) a top-level netlist containing all hardmacros and/or (ii) Verilog stub files of the individual HHMs.

The method 200 generally comprises a state 202, a state 204, a state 206, a state 208, a state 210, a state 212, a state 214, a state 216, a state 218, and a state 220. During the state 202, the method 200 may be configured to present a skeleton netlist and/or an RTL netlist (e.g., one or more of the files NETLIST) to the states 204 and 212. The command -sdc_template may be implemented to generate the file SDC_TEMPLATE (e.g., the state or block 204). The file SDC_TEMPLATE may be configured as a template (or pro forma) that corresponds to the Synopsys Design Constraint (SDC) file format (e.g., the state or block 206). The state 206 may present the file SDC_TEMPLATE to the state 210.

During the state 208, the process 200 may generate one or more time budgets (e.g., the file TIME_BUDGET). The state 208 may present the file TIME_BUDGET to the state 210. The state 210 may load the data contained in the file TIME_BUDGET into the file SDC_TEMPLATE to generate the file SDC_FILE. The state 210 may present the file SDC_FILE to the state 212.

During the state 212 the method (or process) 200 may generate one or more .clf and/or .tech format files (e.g., the files HARDMAC_CLF and HARDMAC_TECH, respectively) in response to the command -sdc and the files NETLIST and SDC_FILE. The state 212 may present the one or more .clf format files (e.g., the file HARDMAC_CLF) to the state 214. The state 212 may present the one or more .tech format files (e.g., the file HARDMAC_TECH) to the state 216. In one example, the state 214 may present the one or more .clf files to a subsequent design and/or analysis tool (e.g., the Avant! design tool) (e.g., the state 218). However, the state 214 may be configured to present the one or more .clf format files to any appropriate design and/or analysis tool (not shown) to meet the design criteria of a particular application. In one example, the state 216 may present the one or more .tech format files to a subsequent design and/or analysis tool (e.g., LSI Logic Corporation MPS and/or MRS design tools) (e.g., the state 220). However, the state 216 may be configured to present the one or more .tech format files to any appropriate design and/or analysis tool (not shown) to meet the design criteria of a particular application.

The tool 200 may generate the SRN flow based on time budgets specified through an SDC file (e.g., the file SDC_FILE) in response to the -sdc command option. The time budgets (e.g., the file TIME_BUDGET) for the method 200 may be generated manually and/or with any appropriate tool or process (not shown) accordingly to meet the design criteria of a particular application. The tool 200 may be configured to generate the technology files in response to data in the SDC file SDC_FILE and from any appropriate technology libraries (e.g., the one or more NETLIST files). The port definition section of the file NETLIST is generally the minimum data needed in the skeleton netlist file NETLIST for operation of the method 200.

The method 200 may be configured to check all the ports in the file NETLIST against the file SDC_FILE and verify that proper constraints have been implemented. When one or more constraints are missing, the method 200 may be configured to generate an error message and then exit (not shown). The SRN flow generation method 200 generally does not generate files in the Is format that corresponds to the synlib suffix (e.g., the file HARDMAC_SYNLIB) or a clock timing file (e.g., the one or more CLK_TIM files) since the files HARDMAC_SYNLIB and CLK_TIM are generally not needed when performing top-down design planning such as the subsequent design planning implemented with the design tool Avant! (e.g., the state 218).

The tool 200 may be configured to generate all technology files (e.g., the intermediate and/or output files SDC_FILE, HARDMAC_CLF, HARDMAC_TECH, etc.) with clock data approximated as ideal clocks (not shown). An insertion delay (not shown) may be set to zero for both minimum and maximum delay conditions. The technology files generated during the process 200 may be not sufficiently accurate to be used for clock tree synthesis. The clock phase may be configured as a non-inverting signal. When an inverted clock definition is desired in an implementation of the tool 200, appropriate manual edits to the technology files may be made by the user to meet the design criteria of a particular application. A full netlist is generally unavailable in the SRN flow method 200. Therefore, clocks may be configured as ideal clocks in the process 200.

The tool 200 may be configured to implement internally generated clocks (not shown) only for .tech suffix format files (e.g., the file HARDMAC_TECH). The tool 200 is generally not configured to implement internal clocks for files having the .clf suffix format. The internal clocks implemented in the .tech format files may be generated via a command (e.g., -create_clock). The internal clock is generally derived independently of a master clock (not shown) that may provide an input signal to the appropriate hardmacro or core.

By default, the method 200 may be configured to constrain a gate enable signal for a gated clock (not shown) in the technology files to whatever clock is specified in a command configured to set an input delay (e.g., a command -set_input_delay). The tool 200 may be configured to generate technology files that support single (e.g., non-multiplexed) clock modes. I/O constraints may be manually set by the user to the desired mode (generally the worst-case mode) prior to the generation of the technology files. When multiple modes are desired, the user may generate multiple technology files and make multiple runs of the subsequent analysis and/or optimization tools (such as Avant!, MPS, etc.). A multiplexer selection signal may be constrained to the clock as specified in the command -set_input_delay.

The tool 200 may be configured to calculate the appropriate technology file (e.g., the files SDC_FILE, HARDMAC_CLF, HARDMAC_TECH, etc.) delays as follows:

input delay arc=clock period−set_input_delay output delay arc=clock period−set_output_delay, where the times set_input_delay and set_output_delay generally correspond to the respective manually selected input and output delays.

The operating conditions of the technology files generated during the process 200 may depend on the file SDC_FILE (e.g., the technology files may be generated in response to the file SDC_FILE). The file SDC_FILE may be generated in response to time budgeting data (e.g., the file TIME_BUDGET). The tool 200 may generate files configured for operating conditions specified in the file SDC_FILE as worst-case values for the particular design application. However, the user may derate one or more timing values accordingly to meet the design criteria of a particular application. When the process 200 is implemented, the timing data in the technology files are generally approximations of the actual design timing.

In one example, the method 200 may be configured to support a limited number of SDC commands as follows:

-set_input_delay, -clock clk_name, -max port_pin_list,

-set_output_delay, -clock clk_name, -max port_pin_list,

-create_clock [-name clkname],

-period pd_value [-waveform x,y], and port_pin_list.

Commands that are not listed above may be unsupported. However, the process 200 may be configured to support any number and/or type of appropriate commands accordingly to meet the design criteria of a particular application.

In one example, the process 200 may be configured to generate the file SDC_TEMPLATE and populate the file SDC_TEMPLATE (e.g., load the file SDC_TEMPLATE with timing budget information contained in the file TIMING_BUDGET) as follows:

First, a skeleton netlist (e.g., BUZZ_1) may be generated (e.g., the state 202) by the commands as follows:

```
module buzz_1 (data, out, clk) ;
    input [0:11] data;
    input clk;
    output [0:11] out;
    parameter LEVEL_HP_HHM_1 = "HARDMAC" ;
endmodule
```

Next, a command line may be implemented to direct the process 200 to generate a SDC_TEMPLATE file (e.g., the state 204) as follows:

lsihmtech -nets buzz_1_stub.v -lang verilog
    -sdc_template\-top_module buzz_1 -tech lcbg12p The above command sequence may generate the file SDC_TEMPLATE as follows:

```
# create_clock section

create_clock -name <CLOCK_1> -period <CLOCK_1_PERIOD> \ -waveform { <RISES_AT>
<FALLS_AT> } [get_ports {<CLOCK_PORT_1>}]
create_clock -name <CLOCK_N> -period <CLOCK_N_PERIOD> \ -waveform { <RISES_AT>
<FALLS_AT> } [get_ports {<CLOCK_PORT_N>}]
# set_input section
# !!! REMOVE ANY PORTS THAT HAVE BEEN DEFINED AS CLOCKS !!!
```

```
-continued set_input_delay <INDELAY_DATA_0_> -clock [get_clocks {<CLOCK_DATA_0_>}] \
    [get_ports {{data[0]}}]
set_input_delay <INDELAY_DATA_1_> -clock [get_clocks {<CLOCK_DATA_1_>}] \
    [get_ports {{data[1]}}]
set_input_delay <INDELAY_DATA_2_> -clock [get_clocks {<CLOCK_DATA_2_>}] \
    [get_ports {{data[2]}}]
set_input_delay <INDELAY_DATA_3_> -clock [get_clocks {<CLOCK_DATA_3_>}] \
    [get_ports {{data[3]}}]
set_input_delay <INDELAY_CLK> -clock [get_clocks {<CLOCK_CLK>}] \
    [get_ports {{clk}}]
# set_output section
set_output_delay <OUTDELAY_OUT_0_> -clock [get_clocks {<CLOCK_OUT_0_>}] \
    [get_ports {{out[0]}}]
set_output_delay <OUTDELAY_OUT_1_> -clock [get_clocks {<CLOCK_OUT_1_>}] \
    [get_ports {{out[1]}}]
set_output_delay <OUTDELAY_OUT_2_> -clock [get_clocks {<CLOCK_OUT_2_>}] \
    [get_ports {{out[2]}}]
set_output_delay <OUTDELAY_OUT_3_> -clock [get_clocks {<CLOCK_OUT_3_>}] \
    [get_ports {{out[3]}}]
```

The files INDELAY_DATA and OUTDELAY_DATA may be implemented as input timing delay and output timing delay timing budget information, respectively (e.g., sub-files contained within the one or more files TIME_BUDGET). In one example, the files INDELAY_DATA and OUTDELAY_DATA may be generated via the state 208. Alternatively, the files INDELAY_DATA and OUTDELAY_DATA may be generated one or more processes external to the process 200 (not shown).

Prior to the implementation of the file SDC_TEMPLATE in the process 200 for RTL synthesis or technology file generation, the timing budget information is populated (e.g., the file SDC_FILE is generated, state 210). The timing information contained in the files INDELAY_DATA and OUTDELAY_DATA may be loaded into the file SDC_TEMPLATE. In addition, a clock file that corresponds to a system clock (e.g., SYSCLK) may be substituted for the clock files CLOCK_PORT, CLOCK_DATA, and CLOCK_OUT. For example, when a system clock (e.g., the clock SYSCLK) is a 100 MHz clock that rises at 5 ns, then the clock constraint may be as follows:

create_clock -name SYSCLK -period 10 -waveform {0 5 } [get_ports SYSCLK].

In one example, the system clock name (e.g., SYSCLK) may be implemented with the same name as a corresponding port. However, alternative clock names may be implemented accordingly to meet the design criteria of a particular application.

In one example, constraints that correspond to the commands -set_input_delay and -set_output_delay may be as follows:

set_input_delay 1.0 -clock [get_clocks SYSCLK] [get_ports {data[0]}]
set_output_delay 2.0 -clock [get_clocks SYSCLK] [get_ports {out [0]}].

In one example, the method 200 may be configured to generate SRN based flow technology files implemented in the format that correspond to the .clf suffix (e.g., the file HARDMAC_CLF) in response to the netlist file BUZZ_1 and the timing file SDC_FILE (e.g., the states 212 and 214) via commands as follows:

lsihmtech -nets buzz_1_stub.v -lang verilog
    -sdc buzz_1.sdc -top_module buzz_1 -tech lcbg12p
    -clf In another example, the method 200 may be configured to generate SRN based flow technology files implemented in the format that correspond to the .tech suffix (e.g., the file HARDMAC_TECH) in response to the netlist file BUZZ_1 and the timing file SDC_FILE (e.g., the states 212 and 216) via commands as follows:

lsihmtech -nets buzz_1_stub.v -lang verilog
    -sdc buzz_1.sdc -top_module buzz_1
    -tech lcbg12p -avtech In another example, the files HARDMAC_CLF and HARDMAC_TECH may be generated simultaneously by placing all of the appropriate switches (or commands) on the command line. However, any appropriate number and/or type of instruction sets may be implemented accordingly to meet the design criteria of a particular application.

Referring to FIG. 3, a flow diagram 300 illustrating a second example operation of the present invention (e.g., the method 100) is shown. The method 300 may be implemented similarly to the method 200. The method 300 may be configured to generate FGN (e.g., full gate) netlist flow based hardmacro technology files and/or clock timing files. The method 300 generally comprises a state 302, a state 304, a state 306, a state 308, a state 310, a state 312, a state 314, a state 316, a state 318, a state 320, a state 322, a state 324, a state 326, a state 328, a state 330, a state 332, a state 334, a state 336, a state 338, a state 340, a state 342, and a state 344. The method 300 may be configured to generate a full gate-level netlist (FGN) flow. The method 300 may be configured to generate the FGN flow when the final hardmacro (HM) netlist (e.g., the file NETLIST) and a corresponding SPEF parasitics file (e.g., the file EXT_PARAS) is available.

The state 302 may be configured to present a full-gate netlist (e.g., the file NETLIST) to the states 306, 308, and 328. The state 304 may be configured to present the extracted parasitics file EXT_PARAS (e.g., the parasitic information that corresponds to design objects implemented in a particular design) to the state 306. The state 306 may be configured to generate (i) the delay data file DELAY_DATA and (ii) a standard delay format delay data file (e.g., SDF) in response to the files NETLIST and EXT_PARAS. The state 306 may present the file DELAY_DATA to the state 310 and the file SDF to the state 312.

The state 310 may be configured to present the file DELAY_DATA to the state 328. The state 312 may be configured to present the file SDF to the state 316. The state 314 may be configured to present timing constraints (or time budgets) to the state 316. In one example, the timing constraints (or time budget) may comprise the file TIME_

BUDGET. However, any appropriate timing constraints may be implemented accordingly to meet the design criteria of a particular application. The state 316 may be configured to generate the file TIMING FILE in response to the files SDF, TIME_BUDGET and HMT_TF_TCL. The state 316 may be configured to present the file TIMING_FILE to the state 324. The state 316 may be implemented via a timing analysis tool such as PrimeTime® (trademark of Synopsys, Inc.) (not shown). However, any appropriate timing analysis tool and/or process may be implemented accordingly to meet the design criteria of a particular application.

The state 318 may be configured to extract and/or generate the TCL script file HMT_TF_TCL in response to the files SDF and TIME_BUDGET. The state 318 may present the file HMT_T_TCL to the state 320. The state 320 may present the file HMT_TF_TCL to the state 316.

The state 308 may be configured to perform name mapping and/or generate the name map file TOP_MODULE in response to the file NETLIST. The state 308 may also be configured to translate information back and forth between one or more source languages and one or more destination languages. The state 308 may present the file TOP_MODULE to the state 322. The state 322 may present the file TOP_MODULE to the state 328. The state 324 may present the file TIMING_FILE to the state 328. The state 326 may present the file PRODUCT_FAMILY to the state 328.

The state 328 may be configured to generate one or more clock timing and/or hardmacro technology files (e.g., the files CLK_TIM, HARDMAC_CLF, HARDMAC_TECH, and HARDMAC_SYNLIB) in response to the files NETLIST, TOP_MODULE, DELAY_DATA, TIMING_FILE, and PRODUCT_FAMILY. The state 328 may present the file CLK_TIM to the state 330. The state 328 may present the file HARDMAC_CLF to the state 332. The state 328 may present the file HARDMAC_TECH to the state 334. The state 328 may present the file HARDMAC_SYNLIB to the state 336.

The state 330 may present the file CLK_TIM to a timing analysis process or method (e.g., the LSI Logic Corporation tool SkewOpt) (e.g., the state 338). However, any appropriate timing analysis method or process may be implemented accordingly to meet the design requirements of a particular application. The state 338 may be configured to generate optimized timing for a circuit layout generated via the method 300.

The state 332 may present the file HARDMAC_CLF to, in one example, the analysis tool Avant! (e.g., the state 340). However, the state 332 may present the file HARDMAC_CLF to any appropriate analysis tool (e.g., a static timing analysis (STA) tool) accordingly to meet the design criteria of a particular application. The state 334 may present the file HARDMAC_TECH to one or more of the LSI Logic Corporation analysis tools MPS and MRS (e.g., the state 342). However, the state 334 may present the file HARDMAC_TECH to any appropriate process or method accordingly to meet the design criteria of a particular application.

The state 336 may present the file HARDMAC_SYNLIB to one or more of the analysis tools Celestry ClockWise, Cadence Design Systems, Inc. PKS, and Synopsys Physical Compiler (e.g., the state 344). However, any appropriate analysis process, tool and/or method may be implemented accordingly to meet the design criteria of a particular application.

The loop configured via the states 316, 318, and 320 may be configured to provide a predetermined level of accuracy that may be desired by the user to meet the design criteria of a particular application. In one example, the predetermined level of accuracy may be configured in response to the design objects of the particular design implementation. However, the user may implement any appropriate level of accuracy to meet the design criteria of a particular application. The method 300 may be configured to implement delay data (e.g., the file HMT_TF_TCL) that have been extracted from reports (e.g., the file TIMING_FILE) after back-annotating a standard delay format timing file (e.g., the file SDF), which has been generated in response to the SPEF parasitics file EXT_PARAS. During the method 300 the hardmacro netlist NETLIST and SPEF parasitics file EXT_PARAS may be presented to the state 306 to generate the standard delay format file SDF for Synopsys PrimeTime (or any appropriate timing analysis tool) static timing analysis (STA). The tool 300 may be configured to generate the technology output files in response to the delay data file DELAY_DATA during the state 328. The file DELAY_DATA may be generated during the state 306. In addition, the method 300 may be configured to generate the technology output files in response to the file TIMING_FILE during the state 328. The file TIMING_FILE may be generated during the state 316.

The method 300 may be configured to generate one or more hardmacro technology files having a common prefix (e.g., the prefix HARDMAC) and a suffix (e.g., the suffixes _CLF, _TECH, and _SYNLIB) that corresponds to the respective file format type (e.g., .clf, .tech, and .synlib) (e.g., the state 328). In one example, the method 300 may implement the following naming command:

CLF/.tech(lsimps/lsimrs)/.synlib=Avant!_Verilog names However, any appropriate number and/or type of naming commands may be implemented accordingly to meet the design criteria of a particular application.

The technology files that are generated having the .clf and the .tech suffix formats generally require Avant!-Verilog compliant naming structure. However, technology files that may be processed by some analysis tools (e.g., Synopsys PrimeTime, etc.) may require Verilog compliant naming structure. At the completion of method 300, (i) a complete Verilog netlist and (ii) name map file generation capability may be unavailable. The method 300 generally provides port names in Avant!-Verilog that are equivalent to the Verilog names. The user of the method 300 generally avoids escaped and/or lengthy HM names that may require mapping when presented to the Avant! analysis tool (e.g., the state 340).

The tool 300 may be configured to generate all of the intermediate and output technology files with clock data approximated as ideal clocks (not shown). Although clock trees (not shown) may be inserted and defined as propagated clocks, the design generated via the process 300 generally does not insert clocks at the top level. One or more commands that correspond to timing uncertainty (e.g., -set_clock_latency and -set_clock_uncertainty) are generally not factored into the technology file values. The clock uncertainty properties are generally defined in the SDC constraints contained in the one or more input files (e.g., NETLIST, EXT_PARAS, PRODUCT_FAMILY, etc.) for the complete design. Though the clocks that are implemented in the process 300 may be approximated as ideal clocks, the .clf format technology file HARDMAC_CLF generally requires clock tree insertion delay values prior to clock tree synthesis. A minimum and a maximum clock insertion delay may be calculated and inserted in a dbSyncPort field (not shown) of the HARDMAC_CLF file. The correct clock phase may be read from the file TIMING_FILE and presented in the output technology files.

Propagated clocks may be unsupported by the tool 300 during the generation of the technology files that may be subsequently processed via the analysis tools MPS/MRS and Avant! (e.g., the files HARDMAC_TECH and HARDMAC_CLF, respectively). However, clock networks (not shown) may be propagated and traced during the generation of the file CLK_TIM (e.g., the state 328). The clocks are generally not defined as propagated during the generation of the file TIMING_FILE. However, if a clock is defined as propagated, the clock may be approximated as an ideal clock during the generation of the technology files.

The tool 300 generally supports internally generated clocks (not shown) during the generation of the file HARDMAC_TECH. However, internal clocks are generally unsupported by the process 300 during the generation of the file HARDMAC_CLF. Subsequent analysis tools (e.g., the tools MPS and MRS) may be configured to process internal clocks as virtual clocks (not shown). The name of the internal clock is generally translated to the name of the virtual clock. The .tech format files that are generated having internal clocks are generally not fully automated. The internal clock is generally derived independently of the master clock (not shown). Therefore, the user may define the internally generated clock via the command -create_clock during the generation of the top-level SDC file SDF (e.g., the state 306).

The method 300 may be configured to present the command -write_sdc in a Synopsys PrimeTime or any other appropriate timing analysis tool implementation of the state 316. The command -write_sdc may automatically generate the command -create_clock. The -write_sdc command generally converts -create_generated_clock statements into -create_clock statements. The user generally manually changes the specified reference pin in the -create_clock statement so that the reference pin references the respective hardmacro/core instance name and virtual clock. In one example, when a hardmacro has the instance name hardmac_inst1 and an internal clock generator circuit has the instance name clkgen_inst in prelayout STA, the user may change the constraints to handle internally generated clocks via commands as follows:

create_clock -name SYSCLK -period 10 -waveform {0 5 } [get_ports {CLK}]
create_generated_clock -name GENCLK -source {get_ports {CLK}} -divide_by 2 {get_pins {clkgen_inst/Q}]
create_clock -name SYSCLK -period 10 -waveform {0 5 } [get_ports {CLK}]
create_clock -name GENCLK -period 20 -waveform {0 10 } [get_pins {clkgen_inst/Q)}]

Hardmacro/core visibility may be lost when top-level physical design optimization is performed. Therefore, the internal clock is generally redefined so that the respective .tech format file retains information necessary for subsequent processing (e.g., processing via the MPS and/or MRS tools) via the following commands:

create_clock -name GENCLK -period 20 -waveform {0 5 } [get_pins {hardmac_inst1/GENCLK}]

The method 300 does not generally constrain a gate enable signal for a gated clock (not shown). An entry (not shown) may be implemented for the gate port in the pin definition section of the technology files. However, constraints are generally not set on the pin that corresponds to the gate enable signal.

The tool 300 may be configured to support single modes in the technology files. The timing constraints are generally set to the desired mode, usually the worst-case mode, prior to the generation of the file TIMING_FILE. When multiple modes are desired, the user may generate multiple technology files. A select pin (not shown) may have an entry in the pin definition section of the respective technology file. However, constraints are generally not set on the select pin.

The method 300 may require that the clock name matches the clock port on the hardmacro or core. When the clock name fails to match the name on the respective hardmacro or core clock port, the user generally specifies a virtual clock in the top level SDC constraints when performing subsequent analysis of files having the .tech suffix format.

Asynchronous signals are generally signals that are presented to pins that correspond to logic control signals (e.g., CLEAR and SET). The assertion of signals such as CLEAR and SET is generally asynchronous, but the de-assertion of the signals CLEAR and SET is generally synchronous. The inactive edge of the signals SET and CLEAR generally occurs a minimum time before the active edge of the clock signal. The constraints that normally model the de-assertion of the asynchronous signal constraints may be designated RECOVERY constraints. The .tech format files may be generated with standard data SETUP constraints on the signals instead of RECOVERY constraints. The overall effect on the design generated via the method 300 may be the same for the SET and CLEAR signals.

The method 300 may be configured to (i) extract one or more delays from the timing constraints file TIMING_FILE and (ii) calculate delays for the appropriate technology file (e.g., the file SDC_FILE (not shown in FIG. 3), HARDMAC_CLF, HARDMAC_TECH, etc.) as follows:

input delay arc=data arrival time−clock network delay
output delay arc=data arrival time−clock network delay The clock network delay may be subtracted from the data arrival time regardless of whether the clock network delay is ideal or propagated.

The operating conditions of the technology files generated during the process 300 may depend on how the state 316 generates the file TIMING_FILE. Timing may also be derated in each is of the tools that implement the technology files generated during the method 300 (e.g., the states 338, 340, 342 and/or 344). However, timing may be derated in the technology file data multiple times when caution is not implemented by the user. The technology files may be generated via the method 300 for a worst-case operating condition and if derating is required, the appropriate technology files may be derated during processing subsequent to the method 300.

The state 316 may generate the timing constraints file TIMING_FILE in response to following delays: (i) the maximum delay from each input port to the first register element, (ii) the maximum delay from the last register element to each output port, and/or (iii) the maximum delay from input to output for entirely combinational paths (described in detail in connection with FIGS. 4(a–c)).

Each hardmacro element in the technology output files in the design generated via the process 300 generally has a timing file generated simultaneously. Prior to the generation of the respective timing file, the design is generally constrained. In one example, a properly constrained design is one that passes the check_timing -verbose command in Synopsys PrimeTime. In another example, a properly constrained design may successfully pass the LSI Logic Corporation LSI ZIC™ analysis. However, any appropriate tool and/or analysis may be implemented to evaluate a design constraint to meet the design criteria of a particular application.

The elements of the file TIMING_FILE that correspond to the respective output files (e.g., HARDMAC_CLF, HARDMAC_TECH, etc.) may be generated for each hardmacro via the following steps: (i) delete any pre-existing versions of the file TIMING_FILE (not shown), (ii) invoke the timing analysis tool that corresponds to the state 316 (e.g., the tool Synopsys PrimeTime, etc.), (iii) load and link the file NETLIST (e.g., the state 302), (iv) load the appropriate timing constraints and/or budget files (e.g., the files EXT_PARAS, PRODUCT_FAMILY, etc.) (e.g., the states 304, 314 and 326), (v) generate the file TIMING_FILE and CLK_TIM (e.g., the states 316 and 328). In one example, the following commands may implement the steps that correspond to the generation of the file TIMING_FILE via the method 300:

```
pt_shell> read_sdf ex_stagelsi_wc.ptimeSDF -analysis_type
on_chip_variation
...
pt_shell> sh lsihmtech -hmt_tf_tcl
pt_shell> source hmt_tf.tcl
Processing input side . . .
...
Processing output side . . .
Processing non-registered paths . . .
```

When the method 300 is implemented to only generate output files in the format having the .tech suffix, the method 300 may be streamlined by specifying -exclude_clock_info in the sh lsihmtech -hmt_tf_tcl command. The resulting file TIMING_FILE may exclude information that may be required for the file CLK_TIM flow.

The streamlined commands may only generate output files having the .tech suffix format. The timing file TIMING_FILE that is generated during the procedure 300 may contain information that may be implemented to generate a number of circuit timing configurations (e.g., delays).

Referring to FIG. 4a, a block diagram of a circuit 400 illustrating a hardmacro input port circuit is shown. The circuit 400 may correspond to an input side timing generated during the state 328 via the method 300 (e.g., a delay PATH_DELAY_1). The circuit 400 generally comprises a device 402, a device 404, a device 406, a device 408, and a device 410. The devices 402 and 404 may be implemented as buffer circuits. The devices 406 and 408 may be implemented as logic gates. In one example, the device 406 may be implemented as an EXCLUSIVE-OR gate and the device 408 may be implemented as an AND gate. The device 410 may be implemented as a register circuit. In one example, the register 410 may be implemented as a flip-flop circuit. However, any appropriate type of gates and/or circuits may be implemented accordingly to meet the design criteria of a particular application. The devices 402, 404, 406, 408, and 410 are generally serially coupled.

The device 402 may have an input that may receive a data signal (e.g., DATA). The device 402 may be implemented at an input of the design generated via the process 300. The circuit 410 may have a clock input that may receive a clock signal (e.g., CLK2). The flip-flop 410 may be implemented as a first (e.g., an initial side) flip-flop in the design generated via the method 300. The delay PATH_DELAY_1 may correspond to a delay of the signal DATA transmitted from an input of the device 402 to a data input of the device 410.

Referring to FIG. 4b, a block diagram of a circuit 400' illustrating a hardmacro non-registered path circuit is shown. The circuit 400' may correspond to an internal delay generated during the state 328 of the design via the method 300 (e.g., a delay PATH_DELAY_2). The circuit 400' generally comprises the device 402, the device 404, the device 406, the device 408, a device 412, and a device 414. The device 412 may be implemented as an AND gate. The device 414 may be implemented as a buffer circuit. However, any appropriate type of gates and/or circuits may be implemented accordingly to meet the design criteria of a particular application.

The device 412 may have an input that may receive the signal DATA. The device 412 may be serially coupled to the serially coupled devices 402, 404, 406, and 408. The device 414 may be serially coupled between the device 408 and an output port (e.g., PORT_GNT[26]). The delay PATH_DELAY_2 may correspond to a delay of the signal DATA transmitted from an output of the device 412 to a data input of the device 414 (e.g., the delay from the output of the first gate to the input of the final gate).

Referring to FIG. 4c, a block diagram of a circuit 400" illustrating a hardmacro output port circuit is shown. The circuit 400" may correspond to an output side timing generated during the state 328 of via the method 300 (e.g., a delay PATH_DELAY_3). The circuit 400" generally comprises the circuits 410, 402, 404, 406, 408, and 414 coupled serially. The delay PATH_DELAY_3 may correspond to a delay of the signal DATA transmitted from an input to the device 410 to a data input of the device 414 (e.g., the delay from the flip-flop to the input of the final gate).

Referring back to FIG. 3, in one example, the following commands may be implemented to execute the method 300 for generation of the FGN flow. The following command lines may be implemented to generate the file HARDMAC_CLF:

lsihmtech -technology lcbg12p -language verilog
-nets hm_full_gate.v -name_map hm_full.nmap
-top_module hm_full -timing_file timing_file
-delaydata hm_full.lsitkdelaydata -clf The following command lines may be implemented to generate the file HARDMAC_TECH:

lsihmtech -technology lcbg12p -language verilog
-nets hm_full_gate.v -name_map hm_full.nmap
-top_module hm_full -timing_file timing_file
-delaydata hm_full.lsitkdelaydata -avtech The following command lines may be implemented to generate the file HARDMAC_SYNLIB:

lsihmtech -technology lcbg12p -language verilog
-nets hm_full_gate.v -name_map hm_full.nmap
-top_module hm_full -timing_file timing_file
-delaydata hm_full.lsitkdelaydata -synlib All of the files HARDMAC_CLF, HARDMAC_TECH, and HARDMAC_SYNLIB may be generated simultaneously by placing all the respective switches on the command line.

Analysis tools that are implemented subsequent to the process 300 may require specific timing information for clock networks (not shown) that are implemented in HHMs and cores. The clock timing file CLK_TIM generated via the method 300 may provide the required specific timing information. The file CLK_TIM generally contains timing data for the minimum and maximum paths, as well as best-case, worst-case, and test conditions, for each of the internal clock networks.

To generate the output clock-timing file CLK_TIM, the process 300 is generally implemented with the input files that correspond to a top-level netlist (e.g., the file NETLIST) and timing and/or delay data files (e.g., the files EXT_PARAS, TIME_BUDGET, PRODUCT_FAMILY, etc.) that correspond to each hardmacro in the design. In one the example, the file CLK_TIM may be generated via the command lines as follows:

```
lsihmtech -tech lcbg12p -language verilog \
-top_module pretzel_core \
-nets pretzel.v id_stage_hm.v ex_stage_hm.v \
-name_map pretzel.nmap \
-delaydata id_stage/id_stagelsi_wc.lsitkdelaydata \
    ex_stage/ex_stagelsi_wc.lsitkdelaydata \
-timing_file id_stage/ptime/timing_file \
```

-continued

```
ex_stage/ptime/timing_file \
-clock_timing
```

During the generation of the clock timing file CLK_TIM (e.g., the state 328), the method 300 may be configured to implement the file DELAY_DATA only for obtaining one or more wire loads and/or cell loads to provide for calculation of capacitance values on the clock pins. For the calculation of capacitance values on the clock pins, a DELAY_DATA file pertaining to any delay case (e.g., best case, worst case, test, etc.) may be adequate.

The clock timing file CLK_TIM may be written to a clock/timing_shells directory (not shown). In one example, commands to implement the generation of the file CLK_TIM via the method 300 may be as follows:

```

module_name: id_stage
instance_name: /id_stage_i2
pin_name: /id_stage_i2/CLK
pin_cap: 0.060302
pos_bestcase_max_delay: 0.2260
pos_bestcase_max_delay_pin: /id_stage_i2/STALL_reg/CP
pos_bestcase_min_delay: 0.2172
pos_bestcase_min_delay_pin: /id_stage_i2/FC_reg_2A/CP
pos_worstcase_max_delay: 0.4520
pos_worstcase_max_delay_pin: /id_stage_i2/STALL_reg/CP
pos_worstcase_min_delay: 0.4366
pos_worstcase_min_delay_pin: /id_stage_i2/FC_reg_2A/CP
neg_bestcase_max_delay: 0.2242
neg_bestcase_max_delay_pin: /id_stage_i2/PC_OUT_reg_6A/CP
neg_bestcase_min_delay: 0.2126
neg_bestcase_min_delay_pin: /id_stage_i2/FC_reg_2A/CP
neg_worstcase_max_delay: 0.4816
neg_worstcase_max_delay_pin: /id_stage_i2/PC_OUT_reg_6A/CP
neg_worstcase_min_delay: 0.4551
neg_worstcase_min_delay_pin: /id_stage_i2/reg_3_d_reg_1A/CP
end_module

module_name: ex_stage
instance_name: /ex_stage_i4
pin_name: /ex_stage_i4/clk
pin_cap: 0.141299
pos_bestcase_max_delay: 0.4678
pos_bestcase_max_delay_pin:
/ex_stage_i4/ShiftReg/alu_out_1_reg_4A/CP
pos_bestcase_min_delay: 0.3473
pos_bestcase_min_delay_pin:
/ex_stage_i4/ShiftReg/mem_in_0_reg_10A/CP
pos_worstcase_max_delay: 0.9523
pos_worstcase_max_delay_pin:
/ex_stage_i4/ShiftReg/alu_out_1_reg_4A/CP
pos_worstcase_min_delay: 0.7309
pos_worstcase_min_delay_pin:
/ex_stage_i4/ShiftReg/mem_in_0_reg_10A/CP
neg_bestcase_max_delay: 0.4547
neg_bestcase_max_delay_pin:
/ex_stage_i4/ShiftReg/alu_out_1_reg_4A/CP
neg_bestcase_min_delay: 0.3492
neg_bestcase_min_delay_pin: /ex_stage_i4/regout1/out_data_reg_19A/CP
neg_worstcase_max_delay: 0.9527
neg_worstcase_max_delay_pin:
/ex_stage_i4/ShiftReg/alu_out_1_reg_4A/CP
neg_worstcase_min_delay: 0.7624
neg_worstcase_min_delay_pin:
/ex_stage_i4/regout1/out_data_reg_19A/CP
end_modul
```

However, any appropriate number and/or type of commands may be implemented accordingly to meet the design criteria of a particular application.

Each hardmacro generally requires a respective timing file TIMING_FILE as an input into the state 328 for the generation of the clock timing file CLK_TIM flow. The file TIMING_FILE may be generated using the file SDF values with best-case delay, worst-case delay, and test delay cases. The file TIMING_FILE generally contains the respective clock sections.

When the timing file TIMING_FILE is generated using the -exclude_clock_info command option, the file TIMING_FILE may not be appropriate for use in the clock timing flow (e.g., the states 330 and 338) and an appropriate timing file is generally generated. The following steps may describe the process of generating a timing file TIMING_FILE that may be implemented for the clock-timing flow that corresponds to the file CLK_TIM: (i) delete any pre-existing versions of the file TIMING_FILE (not shown), (ii) invoke the timing analysis tool that corresponds to the state 316 (e.g., the tool Synopsys PrimeTime, etc.), (iii) load and link the file NETLIST (e.g., the state 302), (iv) load the appropriate timing constraints and/or time budget files (e.g., the files EXT_PARAS, TIME_BUDGET, etc.) (e.g., the states 304 and 314), (v) generate the file TIMING_FILE (e.g., the state 328) for the worst-case condition. In one example, the following commands may implement the steps that correspond to the generation of the file TIMING_FILE via the method 300:

```
pt_shell> read_sdf ex_stagelsi_wc.ptimeSDF -analysis_type
on_chip_variation
. . .
pt_shell> sh lsihmtech -hmt_tf_tcl worst
pt_shell> source hmt_tf.tcl
Processing input side . . .
. . .
. . .
. . .
. . .
Processing output side . . .
Processing non-registered paths . . .
Processing clocks . . .
"timing_file" (e.g., the file (TIMING_FILE) has been generated using
worstcase timings.
Done.
```

In one example, the timing file TIMING_FILE may be updated by appending reports that correspond to the best-case delays via the commands as follows:

```
pt_shell> read_sdf ex_stagelsi_bc.ptimeSDF -analysis_type
on_chip_variation . . .
pt_shell> sh lsihmtech -hmt_tf_tcl best
pt_shell> source hmt_tf.tcl
Appending to an existing timing file.
Processing input side . . .
. . .
. . .
. . .
. . .
Processing output side . . .
Processing non-registered paths . . .
Processing clocks . . .
"timing_file" (e.g., the file (TIMING_FILE) has been updated with
bestcase timings.
Done.
```

The process 300 may be streamlined by specifying -exclude_timing_reqs in the command -hmt_tf_tcl. However, the resulting timing file (e.g., the file TIMING_FILE) (i) may exclude file CLK_TIM information required for clock timing flow (e.g., flow that corresponds to the file CLK_TIM) and (ii) may be implemented only for the generation of files in the format having the .tech suffix (e.g., the file HARDMAC_TECH).

The present invention generally provides (i) more accurate prediction of repeater insertion into a layout, and/or (ii) more accurate delay and slack calculation when compared to conventional hardmacro generation tools.

While the invention has been particularly shown and described with reference to the preferred embodiments thereof, it will be understood by those skilled in the art that various changes in form and details may be made without departing from the spirit and scope of the invention.

What is claimed is:

1. A method for generating one or more hardmacro technology files comprising the steps of:
   (A) determining a netlist;
   (B) generating a timing constraints file in response to (i) said netlist and (ii) a time budget; and
   (C) generating said hardmacro technology files in response to (i) said netlist and (ii) said timing constraints file.

2. The method according to claim 1, wherein:
   said netlist is selected from the group consisting of (i) register-transfer-level (RTL) netlists, (ii) skeleton netlists, (iii) empty module netlists, and (iv) Verilog stub files of individual hierarchical hardmacros (HHMs); and
   said one or more hardmacro technology files are selected from the group consisting of hardmacro technology files generated in a format having a suffix (i) .clf and (ii) .tech.

3. The method according to claim 1, wherein:
   said netlist is configured as a full gate netlist; and
   said one or more hardmacro technology files are selected from the group consisting of hardmacro technology files generated in a format having a suffix (i) .clf, (ii) .tech, and (iii) .synlib.

4. The method according to claim 3, wherein step (B) further comprises generating said timing constraints file in response to (i) one or more delay files and (ii) a timing script file.

5. The method according to claim 4, wherein said one or more delay files comprise standard delay format (SDF) files.

6. The method according to claim 4, wherein step (B) further comprises generating said one or more delay files in response to (i) said netlist and (ii) one or more extracted parasitics.

7. The method according to claim 4, wherein step (B) further comprises generating said timing constraints file to a predetermined level of accuracy.

8. The method according to claim 3, wherein step (B) further comprises generating one or more name map files in response to said netlist.

9. The method according to claim 8, wherein step (C) further comprises generating said one or more hardmacro technology files in response to said one or more name map files.

10. The method according to claim 3, wherein step (B) further comprises generating one or more (i) input side timing delays, (ii) internal delays, and (iii) output side timing delays.

11. The method according to claim 3, wherein step (C) further comprises generating a clock timing file.

12. The method according to claim 11, wherein step (B) comprises the sub-steps of:
   (a) deleting any pre-existing timing constraints file;
   (b) invoking a timing analysis tool;
   (c) loading and linking said netlist; and
   (d) loading said time budget.

13. The method according to claim 1, wherein step (B) further comprises generating (i) a worst case timing file, (ii) a best case timing file, and (iii) a test timing file.

14. The method according to claim 1, wherein said method further comprises the step of translating one or more source languages to one or more destination languages.

15. The method according to claim 1, wherein step (C) further comprises presenting said one or more hardmacro technology file to one or more analysis tools.

16. The method according to claim 15, wherein said analysis tools are selected from the group consisting of Avant! Corporation Avant!, LSI Logic Corporation MPS, LSI Logic Corporation MRS, Celestry Clockwise, Cadence Design Systems, Inc. Physically Knowledgeable Synthesis (PKS), and Synopsys Physical Compiler.

17. The method according to claim 1, wherein step (C) further comprises generating said one or more hardmacro technology files in response to one or more technology library files.

18. The method according to claim 1, wherein said method is configured to provide (i) accurate die size estimates, (ii) accurate prediction of repeater insertion into a layout, (iii) transportable syntax, and (iv) accurate delay and slack calculation.

19. A computer medium containing one or more sets of computer executable instructions for performing steps to generate one or more hardmacro technology files, wherein said steps comprise:
   (A) determining a netlist;
   (B) generating a timing constraints file in response to (i) said netlist and (ii) a time budget; and
   (C) generating said hardmacro technology files in response to (i) said netlist and (ii) said timing constraints file.

20. An apparatus containing one or more sets of computer executable instructions for performing steps to generate one or more hardmacro technology files, wherein said steps comprise:
   (A) determining a netlist;
   (B) generating a timing constraints file in response to (i) said netlist and (ii) a time budget; and
   (C) generating said hardmacro technology files in response to (i) said netlist and (ii) said timing constraints file.

* * * * *